United States Patent
Takeuchi et al.

(10) Patent No.: US 10,451,223 B2
(45) Date of Patent: Oct. 22, 2019

(54) LIGHT BULB SHAPED LAMP

(71) Applicant: Panasonic Intellectual Property Management Co., Ltd., Osaka (JP)

(72) Inventors: Nobuyoshi Takeuchi, Osaka (JP); Tsugihiro Matsuda, Kyoto (JP); Hideo Nagai, Osaka (JP); Masahiro Miki, Osaka (JP); Yoshitaka Kurimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/286,940

(22) Filed: Oct. 6, 2016

(65) Prior Publication Data

US 2017/0023204 A1 Jan. 26, 2017

Related U.S. Application Data

(63) Continuation of application No. 13/394,205, filed as application No. PCT/JP2011/004103 on Jul. 20, 2011, now Pat. No. 9,732,930.

(30) Foreign Application Priority Data

Jul. 20, 2010 (JP) ................................ 2010-162504
Mar. 4, 2011 (JP) ................................ 2011-047336

(51) Int. Cl.
*F21V 21/00* (2006.01)
*F21K 9/235* (2016.01)
(Continued)

(52) U.S. Cl.
CPC .............. *F21K 9/235* (2016.08); *F21K 9/232* (2016.08); *F21K 9/237* (2016.08); *F21K 9/238* (2016.08);
(Continued)

(58) Field of Classification Search
CPC .......... F21V 3/02; F21V 31/005; F21K 9/232; F21K 9/235; H01L 33/62; H01L 25/0753
(Continued)

(56) References Cited

U.S. PATENT DOCUMENTS 2,780,746 A * 2/1957 Arnott ...................... H01K 1/32
250/214 LA
3,598,511 A 8/1971 Ohmae
(Continued)

FOREIGN PATENT DOCUMENTS

| CN | 201016445 Y | 2/2008 |
|---|---|---|
| EP | 2081227 A2 | 7/2009 |

(Continued)

OTHER PUBLICATIONS

Machine Translation of JP2009-016058 of Jan. 22, 2009.
(Continued)

*Primary Examiner* — Laura K Tso
(74) *Attorney, Agent, or Firm* — Greenblum & Bernstein, P.L.C.

(57) ABSTRACT

A light bulb includes an elongated base board having a first end and a second end at opposed ends of a longitudinal axis of the base board, and an upper surface. A single line of light-emitting diodes is arranged parallel to the longitudinal axis of the base board and between the first end and the second end. A base is provided for receiving power. A translucent seal that includes a wavelength conversion material is provided, in which the seal covers the light-emitting diodes and covers the upper surface of the base board. A first power supply lead and a second power supply lead are provided for supplying power to the light-emitting diodes. A housing that houses the base board, the light-emitting diodes, and the power-supply leads, is provided in which the housing is attached to the base.

31 Claims, 8 Drawing Sheets

(51) Int. Cl.
*F21V 9/30* (2018.01)
*F21K 9/232* (2016.01)
*F21V 29/70* (2015.01)
*F21K 9/238* (2016.01)
*F21K 9/237* (2016.01)
*F21V 3/02* (2006.01)
*F21V 9/08* (2018.01)
*F21V 19/00* (2006.01)
*F21V 23/00* (2015.01)
*F21V 31/00* (2006.01)
*F21K 9/66* (2016.01)
*H01L 25/075* (2006.01)
*H01L 33/50* (2010.01)
*H01L 33/52* (2010.01)
*H01L 33/62* (2010.01)
*H01L 33/54* (2010.01)
*F21V 3/00* (2015.01)
*H01L 33/48* (2010.01)
*F21Y 105/10* (2016.01)
*F21K 9/64* (2016.01)
*F21Y 103/10* (2016.01)
*F21Y 115/10* (2016.01)
*H01L 33/32* (2010.01)
*H01L 33/64* (2010.01)

(52) U.S. Cl.
CPC .............. *F21K 9/66* (2016.08); *F21V 3/02* (2013.01); *F21V 9/08* (2013.01); *F21V 9/30* (2018.02); *F21V 19/005* (2013.01); *F21V 23/002* (2013.01); *F21V 29/70* (2015.01); *F21V 31/005* (2013.01); *H01L 25/0753* (2013.01); *H01L 33/505* (2013.01); *H01L 33/507* (2013.01); *H01L 33/52* (2013.01); *H01L 33/54* (2013.01); *H01L 33/62* (2013.01); *F21K 9/64* (2016.08); *F21V 3/00* (2013.01); *F21Y 2103/10* (2016.08); *F21Y 2105/10* (2016.08); *F21Y 2115/10* (2016.08); *H01L 33/32* (2013.01); *H01L 33/48* (2013.01); *H01L 33/502* (2013.01); *H01L 33/647* (2013.01); *H01L 2224/45144* (2013.01); *H01L 2224/45147* (2013.01); *H01L 2224/4903* (2013.01); *H01L 2224/49107* (2013.01); *H01L 2224/73265* (2013.01); *H01L 2924/00011* (2013.01); *H01L 2924/19107* (2013.01)

(58) Field of Classification Search
USPC .......................................................... 362/84
See application file for complete search history.

(56) References Cited

U.S. PATENT DOCUMENTS

| | | |
|---|---|---|
| 6,641,294 B2 | 11/2003 | Lefebvre |
| 7,018,859 B2 | 3/2006 | Liao et al. |
| 7,207,691 B2 | 4/2007 | Lee et al. |
| 7,388,324 B2 | 6/2008 | Foo |
| 7,810,974 B2 | 10/2010 | Van Rijswick et al. |
| 7,872,418 B2 | 1/2011 | Hata et al. |
| 8,068,194 B2 | 11/2011 | Itoh et al. |
| 8,400,051 B2 | 3/2013 | Hakata et al. |
| 8,922,101 B2 | 12/2014 | Hakata et al. |
| 2004/0008525 A1* | 1/2004 | Shibata ............... F21K 9/232 313/271 |
| 2004/0085767 A1* | 5/2004 | Yamashita ............... H01J 5/54 362/260 |
| 2005/0200285 A1 | 9/2005 | Foo |
| 2005/0237005 A1* | 10/2005 | Maxik ............... H05B 33/0818 315/247 |
| 2007/0139949 A1* | 6/2007 | Tanda .................. H01L 33/62 362/551 |
| 2008/0137360 A1 | 6/2008 | Van Rijswick et al. |
| 2008/0231169 A1 | 9/2008 | Hata et al. |
| 2008/0251809 A1 | 10/2008 | Wolf et al. |
| 2009/0080187 A1* | 3/2009 | Chou ................. F21V 29/006 362/231 |
| 2009/0184618 A1* | 7/2009 | Hakata ............... H01L 25/0753 313/1 |
| 2009/0231833 A1* | 9/2009 | Miki .................. H01L 33/505 362/84 |
| 2009/0296017 A1 | 12/2009 | Itoh et al. |
| 2010/0046220 A1* | 2/2010 | Fukasawa ............... F21K 9/00 362/249.02 |
| 2010/0046221 A1 | 2/2010 | Posselt et al. |
| 2010/0109568 A1 | 5/2010 | Camras et al. |
| 2010/0213852 A1 | 8/2010 | Imai |
| 2010/0253221 A1* | 10/2010 | Chiang ................. F21K 9/00 315/32 |
| 2011/0025205 A1 | 2/2011 | Van Rijswick et al. |
| 2013/0099271 A1 | 4/2013 | Hakata et al. |

FOREIGN PATENT DOCUMENTS

| | | |
|---|---|---|
| JP | H02-54107 U | 4/1990 |
| JP | 2001-126510 | 5/2001 |
| JP | 3093138 U | 4/2003 |
| JP | 2005-268221 | 9/2005 |
| JP | 2007-48864 | 2/2007 |
| JP | 2008-515158 | 5/2008 |
| JP | 2008-235824 | 10/2008 |
| JP | 2009-16058 | 1/2009 |
| JP | 2009-021221 | 1/2009 |
| JP | 2010-15798 | 1/2010 |
| JP | 2010-199144 | 9/2010 |
| WO | 2006/035349 | 4/2006 |

OTHER PUBLICATIONS

Emissivity Table from Omega.com.
Machine Translation of JP 2010-015798 of Jan. 21, 2010.
George C. Wei, Arlene Hekcer, and David A. Goodman, "Translucent Polycrystalline Alumina with Improved Resistance to Sodium Attack", 2001, Journal of the American Ceramic Society, vol. 84, No. 12, 2853-2862.
Search Report issued by EPO patent office in EPO Patent Application No. 11809454.9, dated Oct. 26, 2015.
China Office Action, including Search Report, dated Jun. 30, 2014, for the corresponding Chinese Patent Application No. 201180003539.7.
Office Action from Japan Patent Office (JPO), dated Sep. 10, 2013, in corresponding Japanese Patent Application No. 2012-148914.
Office Action from Japan Patent Office (JPO), dated Sep. 10, 2013, in corresponding Japanese Patent Application No. 2012-228442.
Japan Office Action in JP 2011-553185, dated Oct. 2, 2012.
Japan Office Action in JP 2011-553185, dated May 1, 2012.
U.S. Official Action in U.S. Appl No. 15/639,374, dated May 22, 2019.

* cited by examiner

LIGHT BULB SHAPED LAMP

This application is a continuation of U.S. application Ser. No. 13/394,205, filed Mar. 5, 2012, which is a National Phase of PCT Patent Application No. PCT/JP2011/004103, filed Jul. 20, 2011 and claims the benefit of Japanese Patent Application No. 2011-047336 filed on Mar. 4, 2011, Japanese Patent Application No. 2010-162504 filed on Jul. 20, 2010. The entire disclosures of the above-identified applications, including the specifications, drawings and claims are incorporated herein by reference in their entirety.

TECHNICAL FIELD

The present invention relates to LED light bulbs including light-emitting devices, and particularly relates to a light bulb shaped LED lamp having a light-emitting diode (LED).

BACKGROUND ART

Compared to conventional illumination light source, semiconductor light emitting devices such as LEDs are small, have high efficiency and long lifetime as a light source. Recent market needs for saving energy and resource boosts the demand for light bulb shaped lamps using LEDs (hereafter simply referred to as "LED light bulb") and lighting apparatuses including the LED light bulbs. Meanwhile, some manufacturers stop manufacturing incandescent light bulbs using filaments (filament coils).

For example, the patent literature 1 discloses a conventional LED light bulb reproducing the shape of conventional filament in an incandescent light bulb. In the LED light bulb disclosed in the patent literature 1, an optical fiber resembling the shape of a filament is housed in the globe, an end portion of the LED and the optical fiber are provided near the base, and the light emitted from the LED is coupled to the end portion of the optical fiber. With this configuration, the waves of the light emitted from the LED are guided to the inside of the optical fiber. This reproduces a state as if the filament emits light.

CITATION LIST

Patent Literature

[Patent Literature 1] Japanese Unexamined Patent Application Publication (Translation of PCT Application) No. 2008-515158

SUMMARY OF INVENTION

Technical Problem

The incandescent light bulb with the filament that can be seen through the globe is mainly used for decoration. Luminance that allows directly viewing the filament and high luminous flux that would brighten up an area around the light bulb are required for the incandescent light bulb. Accordingly, when replacing the incandescent light bulb with LED light bulb, luminance and luminous flux equivalent to those of the incandescent light bulb are required for the LED light bulb. Higher efficiency and longer lifetime than those of the incandescent light bulb are required for the LED light bulb as well.

Optical fiber is used in the LED light bulb disclosed in the patent literature 1. This becomes loss in coupling and loss in waveguide when coupling and guiding the light emitted from the LED to the optical fiber, which becomes a bottleneck for increasing efficiency. Furthermore, in order to compensate the coupling loss and waveguide loss for obtaining high luminous flux, it is necessary to increase the luminous flux from the LED which is the light source. However, it is necessary to increase the input power to the LED, which causes reduction in efficiency and lifetime.

The present invention has been conceived in order to solve these problems, and it is an object of the present invention to provide a light bulb shaped lamp capable of reproducing the simulative light-emission of the filament in the conventional incandescent light bulb emitting light without using optical fibers.

Solution to Problem

In order to solve the problems described above, an aspect of the light bulb shaped lamp according to the present invention is A light bulb shaped lamp comprising: a base board; a light-emitting device mounted on the base board; a base for receiving power from outside; at least two power-supply leads for supplying power to the light-emitting device; and a globe for housing the base board, the light-emitting device, and the power-supply leads, the globe being partially attached to the base, in which the base board is translucent, each of the two power-supply leads is extended from a side of the base toward inside of the globe and is connected to the base board, and the light-emitting device is provided between (i) a portion at which one of the two power-supply leads and the base board are connected and (ii) a portion at which the other of the two power-supply leads and the base board are connected.

With this configuration, it is possible to implement, using the light-emitting device, a light bulb shaped lamp capable of reproducing the lighting status similar to an incandescent lamp in which the filament can be seen through the globe.

Furthermore, in an aspect of the light bulb shaped lamp according to the present invention, the base board may be supported by the two power-supply leads.

With this configuration, it is possible to simplify the component structure.

Furthermore, in an aspect of the light bulb shaped lamp according to the present invention, a plurality of the light-emitting devices may be mounted in line, and are covered with a sealing material with translucent property, and the sealing material may be formed in line connecting a gap between the light-emitting devices.

With this configuration, it is possible to protect the light-emitting device with the sealing material. Furthermore, by covering the light-emitting device with the translucent material, twinkling light is emitted when the electric bulb shaped lamp is turned on.

Furthermore, in an aspect of the light bulb shaped lamp according to the present invention, the sealing material may include a wavelength conversion material which absorbs light emitted from the light-emitting device and converts a wavelength of the light into another wavelength.

With this configuration, a linear shaped light-emitting part is formed, reproducing the lighting status of the filament in the conventional incandescent light bulb when the light bulb shaped lamp is turned on.

Furthermore, in an aspect of the light bulb shaped lamp according to the present invention, the light-emitting device may not be mounted on a surface of the base board opposite to a surface on which the light-emitting device is mounted, and a second sealing material may be provided on the opposite surface, the second sealing material being provided over, in plan view, the sealing material on the surface on which the light-emitting device is mounted in plan view.

With this configuration, the light emitted from a surface on which no light-emitting device is mounted (for example, blue light) is converted into another color (for example, converted into yellow light), and a synthesized light such as white light is emitted even from a surface on which no light-emitting device is mounted.

Furthermore, in an aspect of the light bulb shaped lamp according to the present invention, the sealing material may be in zig-zag shape.

With this configuration, it is possible to simulate the shape of the filament of the conventional incandescent light bulb.

Furthermore, in an aspect of the light bulb shaped lamp according to the present invention, a surface of the base board on which the light-emitting device is mounted may be in a rectangle shape, the two power supply leads may be connected to shorter sides of the rectangle.

With this configuration, it is possible to simulate the supporting status of the filament part of the conventional incandescent light bulb.

Furthermore, in an aspect of the light bulb shaped lamp according to the present invention, a plurality of the light-emitting devices are mounted on at least two surfaces of the base board.

With this configuration, it is possible to simulate the state of the filament of the conventional incandescent light bulb in which filaments are entwined.

Furthermore, in an aspect of the light bulb shaped lamp according to the present invention, two through holes may be formed in the base board, and one of the two power supply leads may pass through one of the two through holes, and the other of the two power supply leads may pass through the other of the two through holes.

With this configuration, the base board can be firmly connected to the power supply leads.

Furthermore, in an aspect of the light bulb shaped lamp according to the present invention, the base board may be made of a hard-brittle material having an emissivity of 0.8 or higher.

With this configuration, it is possible to promote heat dissipation from the base board.

Furthermore, in an aspect of the light bulb shaped lamp according to the present invention, the base board may be made of translucent ceramic, and the two power-supply leads are copper wires.

With this configuration, it is possible to promote heat dissipation from the base board toward the base through the power supply leads.

Furthermore, in an aspect of the light bulb shaped lamp according to the present invention, an electronic part electrically connected to the ht-emitting device may be housed in the base.

With this configuration, power is appropriately supplied to the light-emitting device.

Furthermore, an aspect of the light bulb shaped lamp according to the present invention includes a first series-connected group and a second series-connected group each of which is a group of a plurality of the light-emitting devices connected in series, in which the first series-connected group and the second series-connected group are electrically connected in an inverse parallel connection, AC power is supplied to the two power-supply leads, and each of the two power-supply leads is electrically connected to each end of the inverse parallel connection.

With this configuration, it is possible to cause the filament part to emit light by the AC power without using the diode for rectification. Accordingly, the circuit configuration is simplified.

Advantageous Effects of Invention

The present invention can reproduce the simulated light-emission state of the filament in a conventional incandescent light bulb emitting light. Furthermore, in the present invention, it is not necessary to use optical fibers. Thus, no coupling loss described above occurs, implementing an LED light bulb with high efficiency and high luminous flux.

Furthermore, since the light-emitting device is covered with the sealing material, the sealing material and the base board becomes the light-emitting unit, thereby implementing an LED light bulb with high efficiency and high luminous flux.

DESCRIPTION OF EMBODIMENTS

The following shall describe the light bulb shaped lamp according to the embodiment of the present invention with reference to the drawings. However, the present invention is determined based on the recitation in Claims. Accordingly, among the components in the following embodiments, the components not recited in the independent claim which illustrates the most generic concept of the present invention are not necessary for solving the problem of the present invention but included as a part of a preferable embodiment. Note that, the diagrams are schematic diagrams, and illustration is not necessarily strictly accurate.

(Embodiment 1)

First, the light bulb shaped lamp according to the embodiment 1 of the present invention shall be described. The light bulb shaped lamp according to the embodiment 1 of the present invention is a light bulb shaped lamp in which LED is used as the light source, and is the LED light bulb replacing conventional light bulb shaped lamp such as incandescent light bulbs and light bulb shaped fluorescent lamps.

(Overall Configuration of LED Light Bulb)

Figure 1:
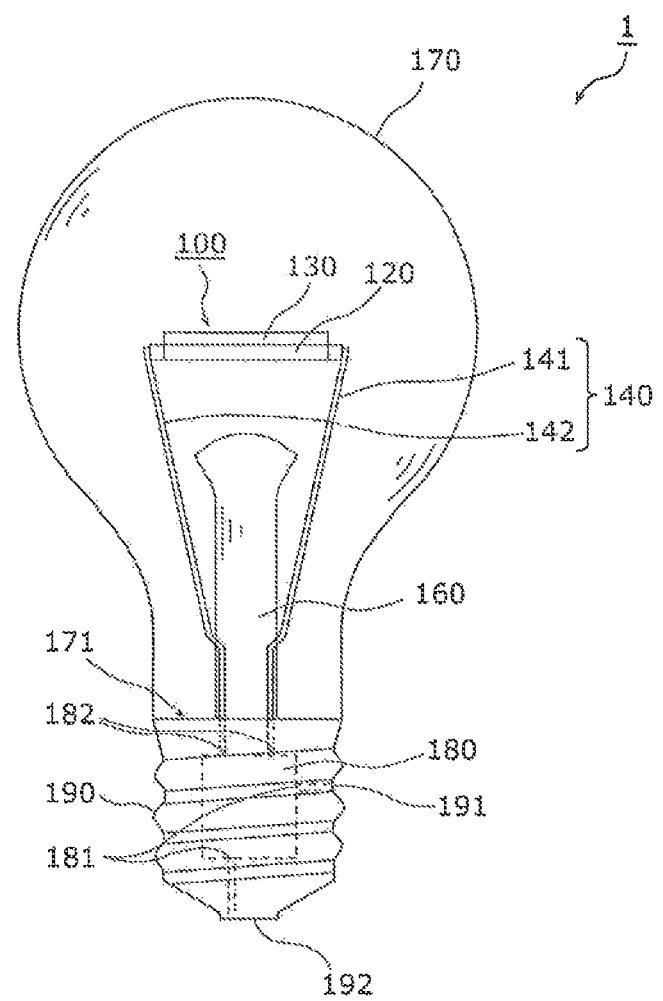
FIG. 1 is a front view of the LED light bulb according to the embodiment 1 of the present invention.

The overall configuration of the LED light bulb according to the embodiment 1 of the present invention shall be described with reference to FIG. 1. FIG. 1 is a top view of the LED light bulb according to the embodiment 1 of the present invention.

As illustrated in FIG. 1, the LED light bulb 1 according to the embodiment 1 of the present invention uses LED chips which are semiconductor light-emitting devices as the light source. The LED light bulb 1 includes a filament part 100 composed of the LED chips and other parts, two power supply leads 140 (141 and 142) for supplying power to the LED chips, a stem 160, a globe 170, a circuit 180 including electronic parts, and a base 190. The filament part 100 is composed of the LED chips 110 (not illustrated) and a base board 120. Note that, in FIG. 1, the circuit 180 and the power supply leads 140 placed inside the base 190 are illustrated in dotted lines.

The filament part 100 is a light-emitting unit (light-emitting module) reproduces the simulated light-emitting property equivalent to the filament in an incandescent light bulb, and emits light with the power supplied from the power supply leads 140. The filament part 100 includes a translucent base board 120 on which the LED chips are mounted, and is housed in the globe 170. In the embodiment 1, the filament part 100 is suspended approximately at the center of the hollow globe 170. As described above, placing the filament part 100 at the center of the globe 170 achieves light-distribution property closely similar to the incandescent light bulb using conventional filament coil when the lamp is turned on for light emission.

In addition, the filament part 100 is suspended in the globe 170 with the support of the two power supply leads 140 (141, 142) at the ends of the base board 120. More specifically, the filament part 100 is off the inner surface of the globe 170 in the globe 170. The two power supply leads 140 are supported by the stem 160. The opening 171 of the globe 170 is closed by the stem 160. The base 190 is attached to hide the closed part. The circuit 180 is housed in the base 190. The two power supply leads 140 (141, 142) extend from the stem 160 to outside of the globe 170, and are connected to the circuit 180. Among the two power supply leads 140 (141, 142) connecting the circuit 180 and the base 190, one of the power supply leads 141 is electrically connected to a screw part 191 on the side surface of the base, and the other power supply lead 142 is electrically connected to the eyelet 192 at the bottom of the base. The following is the more detailed description of the components of the LED light bulb 1 according to the embodiment 1.

(Filament Part)

Figure 2A:
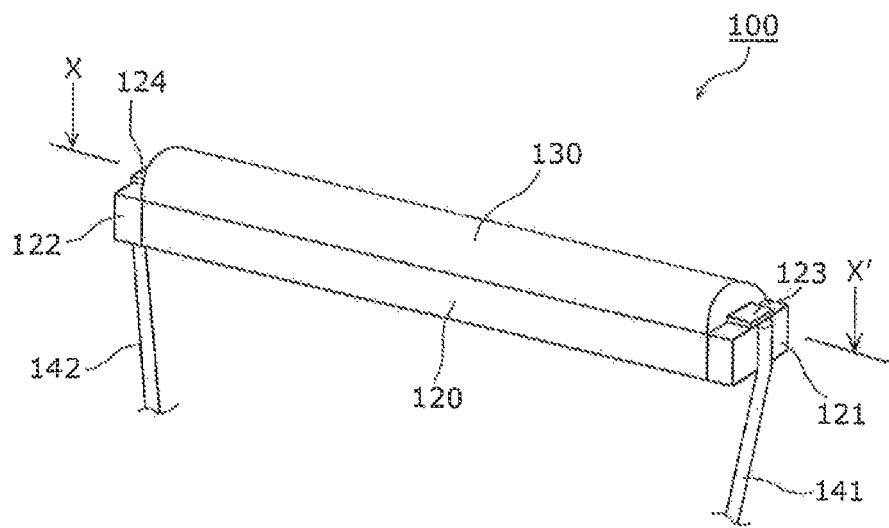
FIG. 2A is a diagrammatic perspective view illustrating the configuration of the filament part in the LED light bulb according to the embodiment 1 of the present invention.

First, the filament part 100 shall be described with reference to FIGS. 2A and 2B. FIG. 2A is a diagrammatic perspective view of the filament part in the LED light bulb according to the embodiment 1 of the present invention, and FIG. 2B is a cross-sectional view of the filament part along X-X' in FIG. 2A.

Figure 2B:
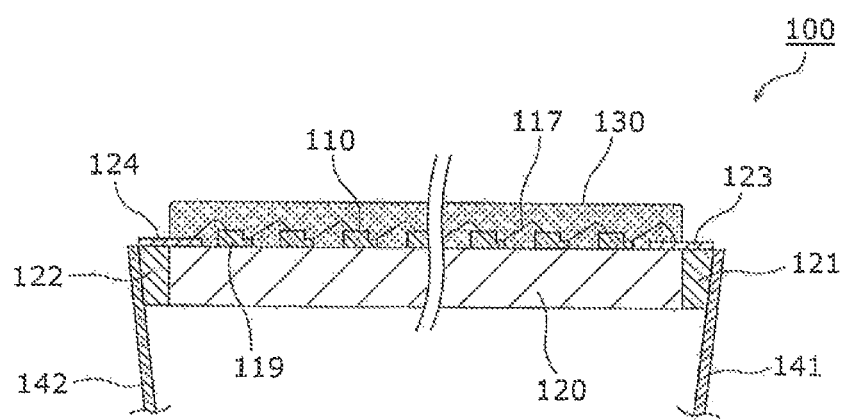
FIG. 2B is a cross-sectional view of the filament part in the LED light bulb according to the embodiment 1 of the present invention (cross-sectional view along X-X' in FIG. 2A).

As illustrated in FIGS. 2A and 2B, the filament part 100 includes a plurality of LED chips 110, a base board 120 on which the LED chips 110 are mounted, and a sealing material 130 for sealing the LED chips 110.

The base board 120 is a mounting base board for mounting the LED chips 110, and is a long board having a first main surface 125 (front surface) composing the surface on which the LED chips 110 are mounted and a second main surface 126 (back surface) composing the surface opposite to the first main surface. A plurality of the LED chips 110 are arranged in a straight line and mounted on the first main surface of the base board 120. The filament part 100 is placed with the first main surface on which the LED chips 110 are mounted facing toward the top of the globe 170.

The base board 120 is composed of a material translucent to visible light. The base board 120 is preferably made of a material with high light transmittance. With this, the light emitted from the LED chip 110 transmits inside the base board 120, and is emitted from a part in which no LED chip 110 is mounted. Accordingly, even when the LED chips 110 are mounted only on the first main surface of the base board 120, the light is emitted from the second main surface 126 and other parts. Thus, it is possible to omnidirectionally emit light from the filament part 100 as the center.

The base board 120 may be made of inorganic material or resin material, and a translucent ceramic board made of alumina or aluminum nitride, a translucent glass substrate, or a flexible substrate made of flexible translucent resin may be used, for example. The base board 120 according to the embodiment 1 is made of ceramic composed of translucent polycrystalline alumina, and is a bar-shaped cuboid 20 mm long, 1 mm wide, and 0.8 mm thick. Accordingly, the shape of the first main surface 125 and the second main surface 126 of the base board 120 is a rectangle with a large aspect ratio. As described above, by making the shape of the base board 120 long, it is possible to reproduce the filament of the incandescent light bulb simulated more closely. Note that, the shape and the size of the base board 120 are examples, and may be in other form or size.

Power supply terminals 121 and 122 for fixing the power supply leads 140 (141, 142) are provided at both ends of the base board 120 in the longer direction, and metal plating made of gold and others is made on the uppermost surface of the power supply terminals 121 and 122. At the power supply terminals 121 and 122 on the ends of the filament part 100, the tip of the power supply leads 140 are electrically and mechanically connected by solder. More specifically, the two power supply leads 140 (141 and 142) are connected to the shorter sides of the first main surface 125 of the rectangle. In the embodiment 1, the base board 120 is attached to the power supply leads 140 such that the first main surface 125 on which the LED chips 110 are mounted faces the top of the globe 170 (in a direction that the second main surface 126 faces the base). In addition, wire bonding pads 123 and 124 electrically connected to the power supply terminals 121 and 122 are provided on both ends of the first main surface 125 of the base board 120.

Twelve LED chips 110 are provided in a straight line between the power supply terminals 121 and 122 on the first main surface 125 of the base board 120. More specifically, the LED chips 110 are provided between a part at which the power supply lead 141 and the base board 120 are connected and a part at which the power supply lead 142 and the base board 120 are connected.

Note that, the base board 120 is preferably made of a material which is not only translucent but also has high heat conductivity and heat emissivity for increasing the heat radiation property. In this case, it is preferable that the base board 120 is made of a material generally referred to as a hard brittle material, such as glass and ceramic. Here, the emissivity is represented by a ratio with respect to heat emission on black body (full radiator), and has a value between 0 and 1, with 1 being the value of black body radiation. The emissivity of glass or ceramic is 0.75 to 0.95, and heat emission close to the black body radiation is achieved. In terms of practical use, the emissivity of the base board 120 is preferably 0.8 or higher, and is more preferably 0.9 or higher. In addition, when the volume of the filament part 100 is small compared to the entire lamp and the heat capacity is small, it is preferable to have a configuration with high emissivity so as to dissipate heat.

Figure 3:
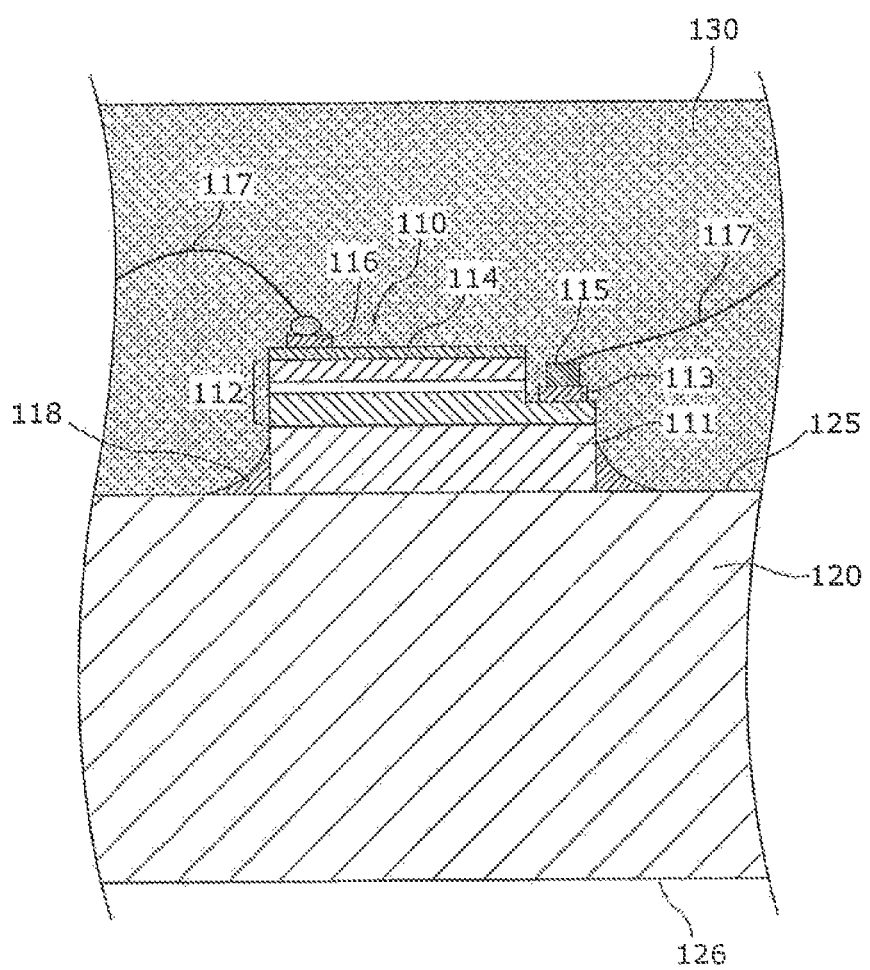
FIG. 3 is a cross-sectional view for describing the configuration of the LED chip and the peripheral part of the LED chip in the LED light bulb according to the embodiment 1 of the present invention.

Next, the detailed description of the LED chip 110 shall be made with reference to FIG. 3. FIG. 3 is a cross-sectional view for illustrating the LED chip and the configuration around the LED chip in the LED light bulb according to the embodiment 1 of the present invention.

As illustrated in FIG. 3, the LED chip 110 includes a sapphire board 111 and a plurality of nitride semiconductor layers 112 stacked on the sapphire board 111 and each having a different composition, is vertically long, and is 600 μm long, 300 μm wide, and 100 μm thick. At an end of the LED chip on a surface opposite to the sapphire board 111, a cathode electrode 113, an anode electrode 114, and wire bonding parts 115 and 116 are formed.

The LED chip 110 is fixed with the chip mounting part 119 (see FIG. 2B) of the base board 120 by a translucent chip bonding material 118 such that the surface on the sapphire board 111 faces the first main surface 125 of the base board 120. Silicone resin containing a filler made of metal oxide may be used as the chip bonding material 118. Note that, using translucent material as the chip bonding material 118 reduces the loss of light emitted from the surface of the LED chip 110 on the sapphire board 111 side and side surfaces of the LED chip 110, and prevents a shadow blocked by the chip bonding material 118. In addition, the LED chips 110 are electrically connected by a gold wire 117. With this, the 12 LED chips 110 are connected in series. The LED chips 110 at the ends of the LED chips 110 connected in series are electrically connected the wire bonding pad parts 123 and 124 that are electrically connected by the gold wire 117 to the feeder terminals 121 and 122 provided at the ends of the base board 120. Note that, in the embodiment 1, one power supply terminal 121 is a cathode power supply terminal, and the other power supply terminal 122 is an anode power supply terminal.

The LED chip 110 according to the embodiment 1 is a bare chip which emits visible light in one color, and a blue LED chip which emits blue light when energized may be used, for example. Note that, in the embodiment 1, an example in which 12 LED chips 110 are mounted is illustrated. However, the number of the LED chips 110 may be determined appropriately depending on the usage. For example, as a replacement for a miniature light bulb, only one LED chip may be used.

The LED chips 110 and the gold wire 117 are covered with the translucent sealing material 130 in a straight line shape. The sealing material 130 is a phosphor containing resin made of a resin containing phosphor particles which are wavelength conversion material, and converts the wavelength (converts color) of light emitted from the LED chip 110 to light with another wavelength, and seals the LED chip 110 for protecting the LED chip 110. In the embodiment 1, the sealing material 130 is formed in a straight line shape covering all of the LED chips 110 arranged in a straight line.

More specifically, translucent resin such as silicone resin may be used as the sealing material 130, and the sealing material 130 is composed of the translucent resin dispersed with phosphor particles (not illustrated) and light-diffusion material (not illustrated). The sealing material 130 with the configuration described above is formed by the following two processes, for example. First, in the first process, the sealing material 130 which is an uncured paste including the wavelength conversion material is applied in a continuous straight line on the row of the LED chips 110 by a dispenser. Next, in the second process, the applied paste of sealing material 130 is cured. The cross-section of the sealing material 130 formed as described above is dome-shaped, and is 1 mm wide and 0.2 mm high. Note that, it is preferable that the width of the sealing material 130 is approximately the same as the width of the base board 120.

Note that, the wavelength conversion material included in the sealing material 130 may be a yellow phosphor such as $(Sr, Ba)_2SiO_4:Eu^{2+}$, $Sr_3SiO_5:Eu^{2+}$, for example. Alternatively, the wavelength conversion material may be a green phosphor such as $(Ba, Sr)_2SiO_4:Eu^{2+}$, $Ba_3Si_6O_{12}N_2:Eu^{2+}$. Alternatively, the wavelength conversion material may be a red phosphor such as $CaAlSiN_3: Eu^{2+}$, $Sr_2(Si, Al)_5(N, O)_8:Eu^{2+}$. The sealing material 130 may not be necessarily be made of silicone resin, and may be made of an organic material such as fluorine series resin or an inorganic material such as a low-melting-point glass or a sol-gel glass. Since the inorganic materials are more highly resistant to heat than the organic material, the sealing material 130 made of inorganic material is advantageous for increasing luminance.

As phosphor particles, when the LED chip 110 is a blue LED chip which emits blue light, a material which absorbs part of the blue light and converts the wavelength of the light into another wavelength is used. For example, YAG series yellow phosphor particles such as $(Y, Gd)_3Al_5O_{12}:Ce^{3+}$, $Y_3Al_5O_{12}:Ce^{3+}$ may be used in order to obtain white light from the blue light. With this, part of the blue light emitted from the LED chip 110 is converted into yellow light by wavelength conversion of the yellow phosphor particles included in the sealing material 130. The blue light which is not absorbed by the yellow phosphor particles and the yellow light obtained by the wavelength conversion of the yellow phosphor particles are diffused and mixed in the sealing material 130, and is emitted as white light from the sealing material 130.

Particles such as silica are used as the light diffusion material. In the embodiment 1, the translucent base board 120 is used. Thus, the white light emitted from the line-shaped sealing material 130 transmits the inside of the base board 120, and is emitted from the back surface and the side surfaces of the base board 120. As described above, the sealing material 130 including the wavelength conversion material is arranged in line on one of the main surfaces of the bar-shaped base board 120. Thus, the base board 120 appears shining like a filament of the conventional incandescent light bulb from any surface of the base board 120 when the light bulb shaped lamp 1 is turned on.

In addition, the sealing material 130 including the wavelength conversion material may be arranged on a surface of the base board 120 on which the LED chip 110 is not mounted. More specifically, as in the embodiment 1, in a configuration in which the LED chip 110 is mounted on the first main surface 125 of the base board 120 and the LED chip 110 is not mounted on the second main surface 126 opposite to the first main surface 125, the sealing material 130 (the second sealing material) is formed on the second main surface 126, in addition to the sealing material 130 (first sealing material) on the first main surface. With this, the blue light emitted from the second main surface 126 on which the LED chip 110 is not mounted is converted into yellow light and white light is synthesized. Accordingly, it is possible to set the color of light emitted from the second main surface 126 on which the LED chip 110 is not mounted closer to the color of light directly emitted from the sealing material 130 on the first main surface 125, allowing emission of white light from both surfaces of the base board 120. As a result, a light-distribution property even more closely similar to the incandescent light bulb can be achieved.

In this case, it is preferable that the sealing material 130 formed on the second main surface 126 is formed over, in plan view, the sealing material 130 formed on the first main surface 125 (in a direction orthogonal to the first and second main surfaces). With this, it is possible for the light from the LED chip to effectively enter the sealing material 130 on both of the main surfaces.

Note that, the wavelength conversion material included in the sealing material 130 may be a yellow phosphor such as $(Sr, Ba)_2SiO_4:Eu^{2+}$, $Sr_3SiO_5:Eu^{2+}$, for example, in addition to the YAG phosphor. Alternatively, a green phosphor such as $(Ba, Sr)_2SiO_4:Eu^{2+}$, $Ba_3Si_6O_{12}N_2:Eu^{2+}$ may also be used. Alternatively, a red phosphor such as $CaAlSiN_3:Eu^{2+}$, $Sr_2(Si, Al)_5(N, O)_8:Eu^{2+}$ may be used.

The sealing material 130 may not be necessarily be made of silicone resin, and an organic material such as fluorine series resin or an inorganic material such as a low-melting-point glass or a sol-gel glass may be used as the sealing material other than the silicone resin. Since the inorganic materials are more highly resistant to heat, than the organic material, the sealing material 130 made of inorganic material is advantageous for increasing luminance.

(Power Supply Leads and Stem)

The two power supply leads 140 (141 and 142) are power supply wires for supplying power to cause the LED chip 110 in the filament part 100 to emit light. Each of the power supply leads 141 and 142 is a composite wire including an internal lead wire, a Dumet wire and an external lead wire joined in this order. The two power supply leads 141 and 142 have strength enough to support the filament part 100, and support the filament part 100 such that the filament part 100 is suspended at a constant position in the globe 170.

In each of the power supply leads 141 and 142, the internal lead wire is an electric wire extending to the inside of the globe 170, and is extended from the stem 160 toward the filament part 100. The external lead wire is an electric wire extending to outside of the globe 170, and is extended from the circuit 180 toward the stem 160. Metal wire mainly containing copper (copper wire) may be used as the internal lead wire and the external lead wire. The Dumet wire is an electric wire sealed inside of the stem 160. The internal lead wire is connected to the power supply terminals 121 and 122 on the base board 120, and the external lead wire is connected to the output terminal 182 in the circuit 180 which shall be described later.

The stem 160 is provided from the opening 171 of the globe 170 toward the inside of the globe 170. More specifically, the stem 160 is formed as a rod-shaped extending part having one end extended in the proximity of the filament part 100. More specifically, the stem 160 according to the embodiment 1 is a component with a shape as if the stem used for conventional incandescent light bulb is extended toward the inside of the globe 170. Note that, the stem 160 may be a stem used for a common incandescent light bulb.

The end portion of the stem 160 on the base side is joined to the opening 171 of the globe 170 so as to close the opening 171. As described above, part of the each of the power supply leads 141 and 142 are sealed in the stem 160. As a result, the filament part 100 inside of the globe 170 is electrically connected to the circuit 180 outside, while keeping the globe 170 airtight. Accordingly, with the LED light bulb 1, it is possible to prevent water or vapor from entering the globe 170 for a long period of time, and to prevent degradation of the components of the filament part 100 or degradation of the connecting part of the filament part 100 and the power supply leads 140 due to moisture. Note that, each of the power supply leads 140 are not necessarily a composite wire, but a single wire composed of a single metal wire.

The stem 160 is made of soft glass transparent to visible light. With this, the LED light bulb 1 can prevent the loss of light emitted from the filament part 100 due to the stem 160. The LED light bulb 1 can also prevent the shadow formed by the stem 160. Furthermore, white light emitted from the filament part 100 illuminates the stem 160. Thus, the light bulb shaped lamp 1 can achieve visually superior appearance. Note that, the stem 160 may not have to close the opening 171 in the globe 170, and may be attached to a part of the opening 171.

Note that, the power supply lead 140 is preferably metal wire containing copper with high heat conductivity. With this, it is possible to actively dissipate heat generated at the filament part 100 to the base 190 through the power supply lead 140. Furthermore, in the embodiment 1, an example in which two power supply leads 140 are included is illustrated. However, it is not limited to this example. For example, when multiple filament parts are housed in the globe and power is supplied to each of the filament parts, each of the filament parts may be supported by separate power supply lead. Note that, each of the power supply leads 140 are not necessarily a composite wire, but a single wire composed of a single metal wire.

(Globe and Stem)

The globe 110 has a shape with one end closed in a spherical shape, and the other end has the opening 171. In other words, the shape of the globe 170 is that the opening 171 provided in a part of hollow sphere is narrowed down while extending away from the center of the sphere. In the embodiment 1, the shape of the globe 170 is Type A (JIS C7710) which is the same as a common incandescent light bulb.

The globe 170 is a hollow translucent component which houses the filament part 100 inside, and emits the light emitted from the filament in part 100 to outside of the lamp. In the embodiment 1, the globe 170 is a hollow glass bulb made of transparent silica glass, and the filament part 100 arranged at the center of the globe 170 can be seen from outside of the globe 170. With this configuration, the loss of the light emitted from the filament part 100 due to the globe 170 can be suppressed. In addition, with the filament part 100 arranged at the center of the spherical globe 170, the omnidirectional light-distribution property is achieved when the light bulb shaped lamp 1 is turned on.

Note that, the shape of the globe 170 does not have to be Type A. For example, the shape of the globe 170 may be Type G or Type E, and may be appropriately selected depending on the usage. The globe 170 does not have to be transparent, and diffusion treatment such as a milky white diffusion film formed by applying silica may be performed. Alternatively, the globe 170 may be colored in red, yellow, or other colors, or a pattern or picture may be drawn thereon. Alternatively, the globe 170 does not have to be made of silica glass. The globe 170 may be made of transparent resin such as acrylic. Forming the globe 170 with glass as described above allows the globe 170 to be highly resistant to heat.

(Circuit and Base)

The circuit 180 is a lighting circuit for causing the LED chip 110 in the filament part 100 to emit light, and is housed in the base 190. More specifically, the circuit 180 includes a plurality of circuit elements and a circuit board on which the circuit elements are mounted. In the embodiment 1, the circuit 180 converts the AC power received from the base 190 into the DC power, and the DC power is supplied to the LED chip 110 through the two power supply leads 140.

Figure 4:
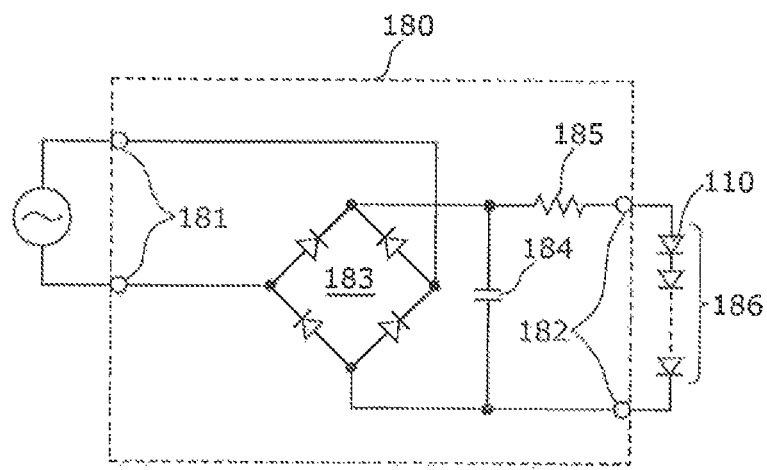
FIG. 4 is a diagram illustrating the circuit configuration of a lighting circuit in the LED light bulb according to the embodiment 1 of the present invention.

FIG. 4 is a diagram illustrating the circuit configuration of the lighting circuit in the LED light bulb according to the embodiment 1 of the present invention. As illustrated in FIG. 4, the circuit 180 in the embodiment 1 includes, as electronic parts (circuit elements), a diode bridge 183 for rectification, a capacitor 184 for smoothing, and a resistor 185 for adjusting current.

Here, input terminals of the diode bridge 183 are input terminals 181 of the circuit 180, and an end of the capacitor 184 and an end of the resistor 185 are output terminals 182 of the circuit 180. Furthermore, the input terminals 131 are electrically connected to the base 190. More specifically, one of the input terminals 181 is connected to the screw part 191 on the side surface of the base, and the other of the input terminals 131 is connected to the eyelet 192 at the bottom of the base. The output terminals 182 of the circuit 180 are connected to the external lead wire of the power supply lead 140. More specifically, the output terminals 182 are electrically connected to a row of LED chips 186 (series-connected group) including the LED chips 110 connected in series.

Note that, the LED light bulb 1 does not have to include the circuit 180. For example, when the DC power is directly supplied from a lighting equipment or a cell, the LED light bulb 1 does not have to include the circuit 180. In this case, one of the external lead wires is connected to the screw part 191, and the other of the external lead wires is connected to the eyelet 192. Note that, the circuit 180 is not limited to a smoothing circuit, but may be an appropriately selected combination of a light-adjusting circuit, a voltage booster, and others.

The base 190 is provided at the opening 171 of the globe 170. More specifically, the base 190 is attached to the globe 170 using an adhesive such as cement to cover the opening 171 of the globe 170. In this embodiment, the base 190 is an E26 base. The LED light bulb 1 is attached to a socket for E26 base connected to the commercial AC power source for use.

Note that, in the embodiment 1, an example using an E26 base is described. However, it is not limited to this example, and the size and the shape of the base may be appropriately selected depending on the usage. For example, an E17 base or others may be used as the base 190. In addition, the base 190 does not have to be a screw base, and may be a base in a different shape such as a plug-in base. Alternatively, the base 190 is directly attached to the opening 171 of the globe 170. However, it is not limited to this example. The base 190 may be indirectly attached to the globe 170. For example, the base 190 may be attached to the globe 170 through resin components such as a resin case. In this configuration, the circuit 180 and others may be housed in the resin case, for example.

(Light Distribution Pattern)

Figure 5A:
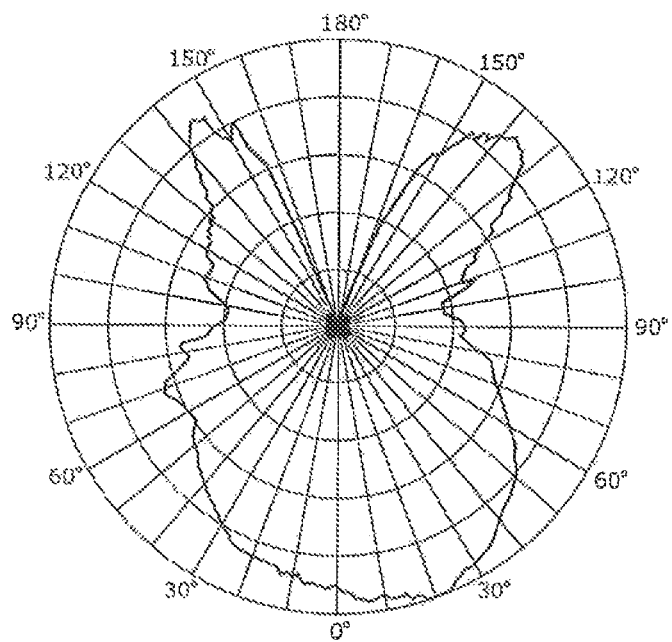
FIG. 5A is a chart illustrating a light-distribution pattern of the LED light bulb according to the embodiment 1 of the present invention in which a base board made of translucent polycrystalline alumina ceramic (total transmittance of 90% or higher) is used.
Figure 5B:
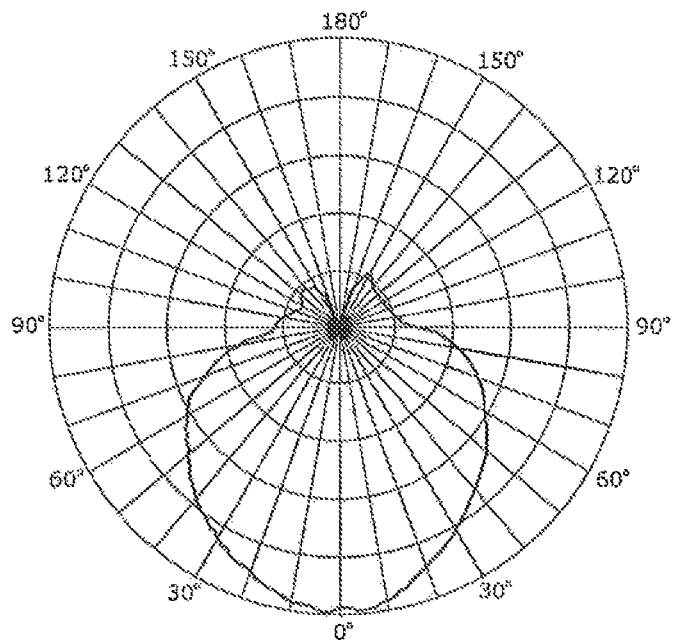
FIG. 5B is a chart illustrating a light-distribution pattern of the LED light bulb according to a comparative example in which a base board made of opaque alumina ceramic is used.

Next, as an example of the effects achieved by the base board 120 in the LED light bulb 1 according to the embodiment 1 of the present invention, light-distribution patterns of the LED light bulbs shall be described with reference to FIGS. 5A and 5B. FIG. 5A is a chart illustrating a light-distribution pattern of the LED light bulb 1 according to the embodiment 1 of the present invention in which a base board made of translucent polycrystalline alumina ceramic having a total transmittance of 90% or higher is used. FIG. 5B is a chart for comparison with FIG. 5A, and illustrates a light-distribution pattern of the LED light bulb according to a comparative example in which a base board made of opaque alumina ceramic is used. Note that, the configurations of the LED light bulbs used for the charts in FIGS. 5A and 5B are identical to the embodiment 1 except for the material composing the base board. In both charts, the light intensity is normalized using the light intensity of an angle having the highest emission intensity. Zero degree is directed toward the globe, and 180 degrees are directed toward the base. In this configuration, since the light is blocked by the metal base, no light is emitted to the 180-degree direction toward the base. Usually, an LED light bulb is attached to the ceiling. In this case, the globe is on the lower side, and the base is on the upper side (ceiling side).

According to the light-distribution pattern of the LED light bulb 1 according to the embodiment 1 using a translucent base board illustrated in FIG. 5A, the light from the LED light bulb 1 is strongly emitted in the 20-degree direction on the globe side and 150-degree direction on the base side, which indicates a wide distribution angle of light. In contrast, according to the light-distribution pattern of the LED light bulb according to a comparative example using an opaque base board illustrated in FIG. 5B, the light from the LED light bulb is strongly emitted in 0-degree direction on the globe side. However, the light is sparsely emitted toward the 150-degree direction on the base side, and the intensity of the light is merely approximately 20% of the highest intensity. Furthermore, an emission angle set to be an angle at which the intensity of light is half the highest intensity is approximately 110 degrees in the light emitted from the LED light bulb in FIG. 5A, and is narrow in the radiation angle of the light emitted from the LED light bulb in FIG. 5B, at approximately 70 degrees. As described above, the LED light bulb in FIG. 5A can achieve wider light distribution angle than the distribution angle of the LED light bulb in FIG. 5B, and a light-distribution pattern closer to that of the incandescent light bulb with which the filament can be seen from any direction is achieved. Note that, the direction at which the emission intensity on the globe side of the LED light bulb in FIG. 5A should be 0 degree, but is 20 degrees. This is probably because the base board 120 is slightly tilted.

(Variation of Filament Part)

Figure 6A:
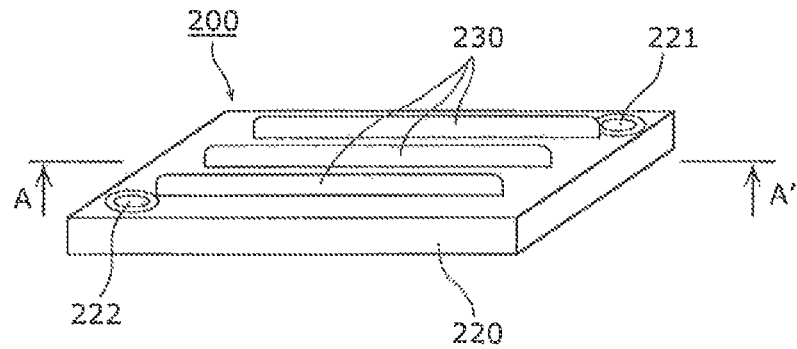
FIG. 6A is a diagrammatic perspective view illustrating the configuration of the filament part in the LED light bulb according to the variation of the embodiment 1 of the present invention.
Figure 6B:
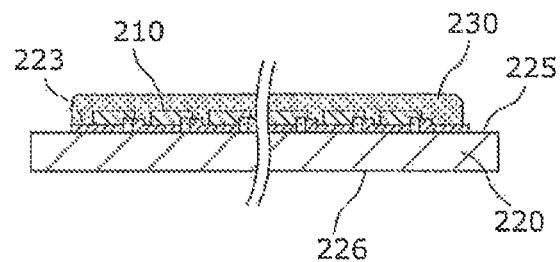
FIG. 6B is a cross-sectional view of the filament part in the LED light bulb according to the variation of the embodiment 1 of the present invention (cross-sectional view along A-A' in FIG. 6A).

Next, a variation of the LED light bulb according to the embodiment 1 of the present invention shall be described with reference to FIGS. 6A and 6B. FIG. 6A is a diagrammatic perspective view of the filament part in the LED light bulb according to the variation of the embodiment 1 of the present invention. FIG. 6B is a cross-sectional view of the filament part in the LED light bulb along AA' in FIG. 6A.

The LED light bulb according to this variation is different from the LED light bulb according to the embodiment 1 in the configuration of the filament part, and the rest of the configuration is identical. Accordingly, in this variation, the filament part 200 shall be mainly described. The filament part 200 according to the variation includes a translucent tabular base board 220 and a plurality of rows of LED chips 210.

In this variation, the base board 220 is composed of ceramic made of aluminum nitride, and is a tabular board which is a rectangle 20 mm long, 10 mm wide, and 0.8 mm thick. Two through holes 221 and 222 are provided in the base board 220. The two through holes 221 and 222 are provided at the diagonal ends of the base board 220, and the power supply leads 140 (141 and 142) passes through the two respective through holes and fixed with solder. More specifically, the power supply lead 141 passes through one of the through holes 221, and the power supply lead 142 passes through the through hole 222. The leads and the through holes are electrically and mechanically connected with solder.

Furthermore, 30 LED chips 210 which emit violet light are mounted on the first main surface 225 of the base board 220. The LED chip 210 is composed as three rows of LED chip rows, and one LED chip row includes 10 LED chips 210. A part of the metal line pattern 223 plated with gold on the surface is a chip mounting part. The LED chip 210 in the variation is mounted by a process known as flip chip bonding with which the cathode electrode and the anode electrode of the LED chip 210 are connected to the chip mounting part. Each of the 10 LED chips 210 included in a row is connected in series, and the three rows are connected in series with one another. In other words, all of the 30 LED chips 210 are connected in series. Note that, the metal line pattern 223 may be formed using a transparent conductive material such as indium tin oxide (ITO). By having the metal line pattern 223 made of a transparent conductive material allows reducing the loss due to light absorption compared to the case in which the light-blocking metal material is used. In addition, the shadow caused by blocked light does not appear either.

Each of the rows of LED chips of the LED chips 210 is sealed in line by the sealing material 230 including the wavelength conversion material. With this, it is possible to reproduce the LED light bulb as if there are three filaments. In this variation, the aluminum nitride composing the base board 220 is clear and transparent. Thus, when viewed from the second main surface 226 side opposite to the first main surface 225 on which the LED chip 210 is mounted, it is possible to view the shape of the sealing material 230 clearly. As in this variation, since the filament part is composed of a plurality of LED chip rows (series connected group), each row can be easily recognized from an opposite main surface side on which the LED chips are not mounted.

Note that, when the LED chip 210 which emits violet light is used as in this variation, the filament part 200 which emits white light can be achieved by using blue phosphor, green phosphor, and red phosphor as the wavelength conversion material included in the sealing material 230.

In addition, the power supply leads 140 support the filament part 200 at the diagonal parts of the base board 220 in a square in this variation. However, it is not limited to this example. Alternatively, the filament part 200 may be supported at the central part of opposite two sides of the rectangle base board 220, or supported at the both ends of one side. In particular, when the base board 220 is placed vertically facing the main surface of the base board on which the LED chip is mounted toward the side part of the globe 170, the part supporting the base board 220 is located at the stem side. Thus, it is possible to shorten the length of the power supply lead 140.

(Embodiment 2)

Figure 7:
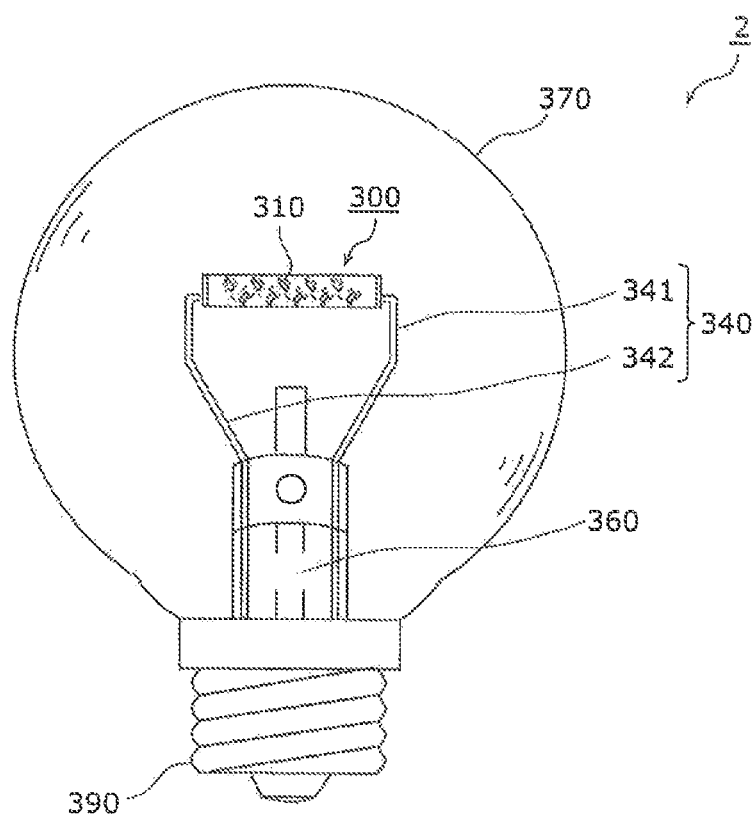
FIG. 7 is a front view of the LED light bulb according to the embodiment 2 of the present invention.

Next, an LED light bulb 2 according to the embodiment 2 of the present invention shall be described with reference to FIGS. 7 to 9. FIG. 7 is a front view of the LED light bulb according to the embodiment 2 of the present invention.

As illustrated in FIG. 7, the LED light bulb 2 according to the embodiment 2 of the present invention is different form the LED light bulb 1 according to the embodiment 1 in that a spherical (Type G) globe 370 is used, that the LED chips 310 are mounted on both surfaces of the base board 320, and that the two rows of LED chips (series connected group) that were connected in series are inversely connected in parallel.

Figure 8A:
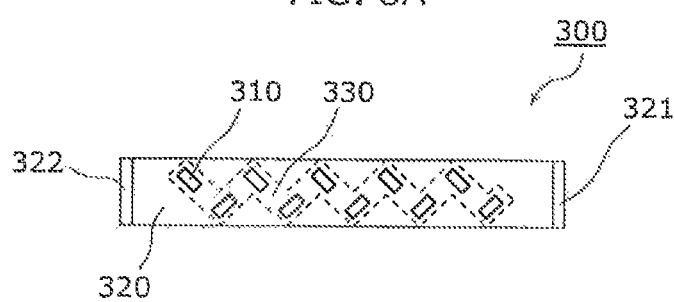
FIG. 8A is top view illustrating the configuration of the filament part in the LED light bulb according to the embodiment 2 of the present invention.

FIG. 8A is a top view of the filament part 300 in the embodiment 2. The filament part 300 is formed as follows: a plurality of LED chips 310 are arranged in a zigzag line and mounted on translucent base board 320; the sealing material 330 including the wavelength conversion material is applied in zigzag shape along the LED chips 310 arranged in zigzag in an area surrounded by the broken line in FIG. 8A. The LED chips 310 are located at the inflection points of the zigzag shape. By shaping the sealing material 330 in a shape other than a straight line gives variety to the shape of the filament part.

Figure 8B:
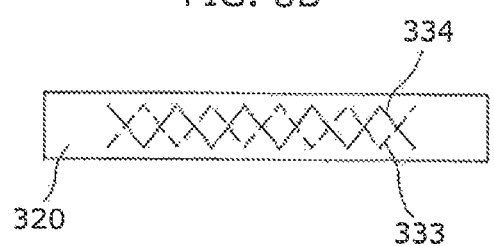
FIG. 8B is a diagram illustrating the arrangement of a sealing material in the filament part of the LED light bulb according to the embodiment 2 of the present invention.

In addition, in the embodiment 2, the LED chips 310 are arranged in zigzag on both sides of the base board 320. The zigzag shaped sealing material 330 is applied on the LED chips 310 on both surfaces. In this case, the sealing materials 330 located on one of the main surfaces (first main surface) and on the other of the main surfaces (second main surface) are preferably formed such that the zigzag shapes cross each other. With this configuration, when viewing the base board 320 from one of the main surfaces, the sealing material 330 on the other main surface can be seen through. With this, the appearance of two entwined filaments can be reproduced. This configuration shall be described with reference to FIG. 8B. FIG. 8B is a diagram illustrating the arrangement of the sealing material 330 according to the embodiment 2. In FIG. 8B, the arrangement of the sealing material 330 on one of the main surfaces of the base board 320 and the other of the main surfaces of the base board 320 is illustrated in the broken line 333 and the solid line 334.

Note that, in the embodiment 2, the LED chips are arranged on both surfaces of one base board. However, it is not limited to this example. For example, two boards on which the LED chips are mounted only on one main surface are prepared and the other main surfaces on which no LED chip is mounted are bonded. With this, the base board on which the LED chips are mounted on both surfaces can be made. In this case, the same effects as the embodiment described above can be achieved.

Figure 9:
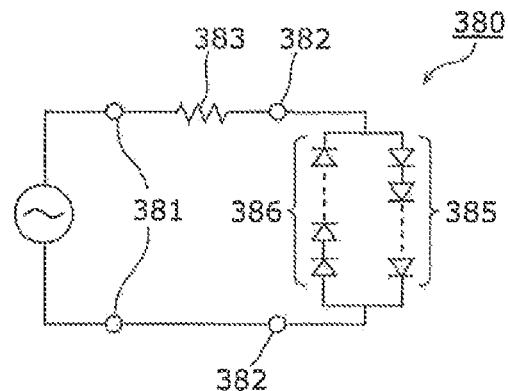
FIG. 9 is a diagram illustrating the circuit configuration of a lighting circuit in the LED light bulb according to the embodiment 2 of the present invention.

FIG. 9 illustrates the circuit configuration of the circuit 380 used for the LED light bulb according to the embodiment 2. As illustrated in FIG. 9, in the LED chip row 385 (first series connected group) arranged on one of the main surfaces and the LED chip row 386 (second series connected group) arranged on the other of the main surfaces, the LED chips in the rows of the LED chips are connected in series. Furthermore, the LED chip row 385 and the LED chip row 386 are electrically connected in inverse parallel connection. Furthermore, one of the connecting parts on which one end of the LED chip row 385 and the one end of the LED chip row 386 are connected, and the other connecting part on which the other end of the LED chip row 385 and the other end of the LED chip row 386, that is, both ends of the inverse parallel connection are connected to the power supply terminals 321 and 322, and electrically connected to the power supply leads 341 and 342 (in FIG. 7). Note that, the LED chips that are side-by-side belong to different LED chip rows (series connected group).

In the circuit 380, the input terminals 381 are electrically connected to the base 390, and the output terminals 382 are electrically connected to the power supply terminals 321 and 322 in the filament part 300 through the power supply leads 340 (341, 342) in the stem 360. With the configuration described above, AC power is supplied from the base 390 to the power supply lead 340, and AC power is supplied to the ends of the inverse parallel connection. With this, in one cycle, one of the LED chip rows (for example, the LED chip row 385) is turned on; the other of the LED chip rows (for example, the LED chip row 386) is turned off. And it is reversed in the next cycle; thereby the two LED chip rows 385 and 386 keep alternately blinking. Accordingly, in the embodiment 2, the lighting circuit can be configured without using electronic parts for converting the AC power to the DC power such as a diode bridge for rectification. This allows composing the circuit only with the resistor 383 for adjusting current, simplifying the circuit configuration.

Note that, in the embodiment 2, the power supply leads 340 (341, 342) are attached to the base board 320 in a direction that both of the main surfaces of the base board 320 on which the LED chips 310 are mounted facing the side part of the globe 370. Note that, the direction of the attachment of the power supply leads 340 (341 and 342) on the base board 320 may be appropriately determined depending on the design of the LED light bulb. In addition, in the embodiment 2, the filament part 300 is arranged in a direction that the rows of the LED chips 310 composing the filament part 300 crosses the central axis of the globe 370. The direction may be appropriately determined depending on the design of the LED light bulb. For example, the filament part 300 may be arranged in parallel with or oblique to the central axis of the globe 370.

As described above, in the LED light bulb 2 according to the embodiment 2 of the present invention, the light-distribution pattern with a wide light-distribution angle can be achieved, achieving the omnidirectional light-distribution property close to that of the incandescent light bulb, in the same manner as the embodiment 1.

(Variation of Filament Part)

Next, a variation of the LED light bulb according to the embodiment 2 of the present invention shall be described with reference to FIGS. 10 to 13. FIGS. 10 to 13 are diagrams for illustrating the variations 1 to 4 of the filament part in the LED light bulb according to the embodiment 2 of the present invention. Note that, for simplifying the description, illustration of the LED chips and the power supply terminals is omitted in these diagrams. Note that, the configuration of the sealing material is the same as described above, and the sealing material includes the wavelength conversion material.

Figure 10:
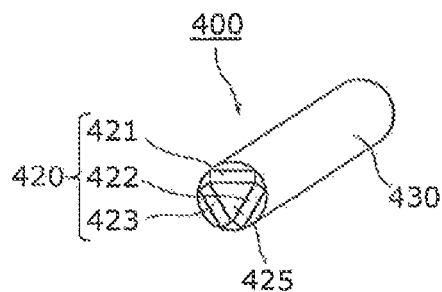
FIG. 10 is a diagram (diagrammatic perspective view) for describing the variation 1 of the filament part of the LED light bulb according to the embodiment 2 of the present invention.

In the filament part 400 in the variation 1 illustrated in FIG. 10, three translucent base boards 420 (421, 422, and 423) on which the LED chips are mounted compose three side faces of a triangle pole, and the entire triangle pole is covered with the sealing material 430 including the wavelength conversion material, forming a cylindrical light-emitting unit as a whole. As described above, the filament part 400 according to the variation 1 reproduces the shape of the cylindrical filament.

This configuration is advantageous because the power supply leads (not illustrated) may be inserted and fixed in the inner area 425 of the triangle pole surrounded by the three base boards 421, 422, and 423. With this, it is possible to actively radiate the heat generated at the LED chip through the power supply leads.

Figure 11:
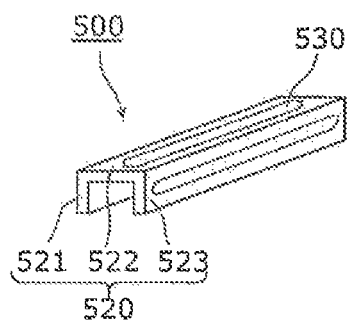
FIG. 11 is a diagram (diagrammatic perspective view) for describing the variation 2 of the filament part of the LED light bulb according to the embodiment 2 of the present invention.

The filament part 500 in the variation 2 illustrated in FIG. 11 is composed of three translucent base boards 520 (521, 522, and 523) on which the LED chips are mounted are arranged such that the cross-section is U-shaped with all corners in straight angles.

This configuration is advantageous because the LED chip mounted surface of the base board 522 in the middle is arranged facing the top side of the globe. In addition, the LED chip mounted surfaces of the base boards 521 and 523 on both sides are arranged facing the side surface of the globe. With this configuration, the sealing material 530 can be recognized from any direction. With this, the light-emission shape of the filament part 500 is even more close to the light-emission shape of the filament of the incandescent light bulb when emitting light.

Figure 12:
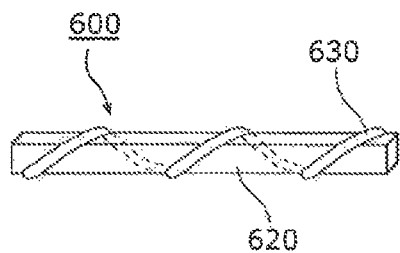
FIG. 12 is a diagram (diagrammatic perspective view) for describing the variation 3 of the filament part of the LED light bulb according to the embodiment 2 of the present invention.

The filament part 600 according to the variation 3 illustrated in FIG. 12 is composed by arranging the LED chips and the sealing material 630 wound around the translucent polygonal column base board 620.

The configuration is advantageous because the shape of the filament of the conventional incandescent light bulb, that is, a spring shape can be reproduced.

Figure 13:
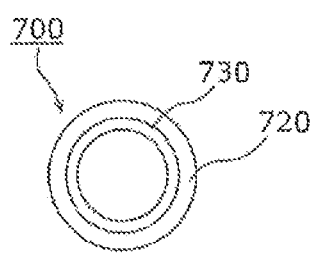
FIG. 13 is a diagram (top view) for describing the variation 4 of the filament part of the LED light bulb according to the embodiment 2 of the present invention.

The filament part 700 according to the variation 4 in FIG. 13 is composed by arranging the LED chips and the sealing material 730 in a ring on the circular translucent base board 720.

Note that, the shape of the arrangement of the LED chips and the sealing material 730 is not limited to a circular ring, but may be a shape that cannot be achieved by the filament of the conventional incandescent light bulb such as square, star, characters, graphic, signs, or cartoon characters.

In addition, the shape of the base board 720 may also have a variety not only square or circle, but also star, characters, graphic, signs, or cartoon characters.

(Other Variation of Filament Part and Others)

The light bulb shaped lamp according to the present invention has been described above based on the embodiments and variations. However, the present invention is not limited to the embodiments and others.

In the embodiments the filament part is configured to emit white light using the LED chips and the sealing material including the wavelength conversion material as an example. However, it is not limited to this example.

For example, the filament part can be configured with yellow to amber LED chips along with translucent sealing material that does not include the wavelength conversion material. Light bulb with low luminous flux is generally used for purposes that does not require high color rendition. For these purposes, the light from incandescent light bulb can be reproduced using only the light from the LED chip.

Needless to say, the color of light emitted from the LED chip, whether or not the wavelength conversion material is used, or the type of the wavelength conversion material may also be selected appropriately.

For example, a configuration in which LED chips of light's three primary colors, i.e., blue, green, and red are used to obtain white light, a configuration in which LED chips having a wavelength from blue-violet to a near-ultraviolet range, and phosphors of the three primary colors, i.e., blue, green, and red are used to obtain white light, or a configuration in which light in a single color such as blue only, green only, or red only is used is possible as a configuration of the filament part.

In addition, although LED is used as an example of the light-emitting device in the embodiments, the light-emitting device may be a so semiconductor laser, organic electro luminescence (EL), or inorganic EL.

The LED light bulb according to the embodiments and the variations may be attached to the lighting equipment provided on the ceiling of a room, and can be implemented as a lighting apparatus. The lighting apparatus includes the LED light bulb and the lighting equipment (light-up equipment). The lighting equipment includes an equipment body attached to the ceiling and a lamp cover covering the LED light bulb, and a socket for attaching the base of the LED light bulb is provided in the equipment body. Power is supplied to the LED light bulb through the socket.

Those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The light bulb shaped lamp according to the present invention reproduces the simulated filament of the incandescent light bulb by the light-emitting device such as the LED chips and the base board. The present invention is particularly effective for a light bulb shaped lamp replacing conventional incandescent light bulbs, and particularly a light bulb shaped lamp replacing the incandescent light bulb for decorative purpose showing the filament.

REFERENCE SIGNS LIST 1,2 LED light bulb
100, 200, 300, 400, 500, 600, 700 Filament part
110, 210, 310 LED chip
111 Sapphire board
112 Nitride semiconductor layer
113 Cathode electrode
114 Anode electrode
115, 116 Wire bonding part
117 Gold wire
118 Chip bonding material
120, 220, 320, 420, 421, 422, 423, 520, 521, 522, 523, 620, 720 Base board
121, 122, 321, 322 Power supply terminal
125, 225 First main surface
126, 226 Second main surface
130, 230, 330, 430, 530, 630, 730 Sealing material
140, 141, 142, 340, 341, 342 Power supply lead
160, 360 Stem
170, 370 Globe
180, 380 Circuit
181, 381 Input terminal
182, 382 Output terminal
133 Diode bridge
184 Capacitor
135, 383 Resistor
186, 385, 386 LED chip row
190, 390 Base
191 Screw part
192 Eyelet
221, 222 Through hole
223 Metal line pattern
425 Inner area

What is claimed is:

1. A light bulb comprising:
an elongated filament comprising:
an elongated base board having a first end and a second end at opposed ends of a longitudinal direction of the base board, an upper surface and side surfaces extending in the longitudinal direction of the base board;
a single line of light-emitting diodes arranged parallel to the longitudinal direction of the base board and between the first end and the second end; and
an elongated translucent seal including a wavelength conversion material, the elongated translucent seal enclosing all of the light-emitting diodes of the single line;
a base that receives power;
a lighting circuit that is provided in the base and causes the single line of light-emitting diodes to emit light;
a stem comprising soft glass transparent to visible light;
a first power supply wire and a second power supply wire through which power is supplied to the single line of light-emitting diodes, the first power supply wire being connected to the first end of the base board on one end and to the lighting circuit on an other end, the second power supply wire being connected to the second end of the base board on one end and to the lighting circuit on an other end, each of the first and second power supply wires comprising a Dumet wire sealed inside the stem; and
a housing that houses the base board, the single line of light-emitting diodes, and the first and second power-supply wires, the housing being attached to the base,
wherein the housing has an opening closed by the stem so as to keep the housing airtight,
the first power supply wire and the second power supply wire extend from the elongated filament to the stem, extend into the stem via a longitudinal side surface of the stem, and extend from the stem to the lighting circuit provided in the base via an interior of the stem,
wherein the elongated translucent seal including the wavelength conversion material contacts all of the light-emitting diodes of the single line, and
a cross-section of the elongated translucent seal, that covers the upper surface and the side surfaces of the base board, has a semicircular shape that is uniform along the longitudinal direction of the base board.

2. The light bulb according to claim 1, further comprising:
a first power supply terminal at the first end and a second power supply terminal at the second end, wherein
the first power supply terminal is electrically connected to the first power supply wire and the second power supply terminal is electrically connected the second power supply wire.

3. The light bulb according to claim 2,
wherein the first power supply terminal is fixed to the first power supply wire and the second power supply terminal is fixed to the second power supply wire.

4. The light bulb according to claim 1,
wherein the light-emitting diodes are connected in series, and
wherein one of the light-emitting diodes is electrically connected to the first power supply wire and another of the light-emitting diodes is electrically connected to the second power supply wire.

5. The light bulb according to claim 1,
wherein the seal has a linear shape.

6. The light bulb according to claim 1,
wherein the base board is a translucent material.

7. The light bulb according to claim 1,
wherein the base board is composed of a resin material or a ceramic.

8. The light bulb according to claim 1,
wherein the light-emitting diodes are fixed to the base board by a bonding material.

9. The light bulb according to claim 1, wherein the seal has a width greater than a width of the base board.

10. The light bulb according to claim 1, wherein the housing comprises a globe.

11. The light bulb according to claim 1, wherein the single line of light-emitting diodes comprises a straight line.

12. The light bulb according to claim 1, wherein
the elongated translucent seal and the filament have a cylindrical shape.

13. The light bulb according to claim 1, wherein
the wavelength conversion material included in the elongated translucent seal is a red phosphor.

14. The light bulb according to claim 1,
wherein the stem extends inside the housing,
wherein a width of the stem inside the housing is equal to or greater than a width of the opening of the housing, and
wherein a length of the stem in an extending direction of the stem is greater than the width of the stem.

15. The light bulb according to claim 1, wherein the elongated translucent seal including the wavelength conversion material comprises a single layer extending from the light emitting diodes to an outer-most surface of the semicircular shape.

16. The light bulb according to claim 1, wherein the elongated translucent seal further encloses the entire base board.

17. The light bulb according to claim 1, wherein each of the first and second power supply wires is a composite wire including an internal lead wire, the Dumet wire and an external lead wire joined in this order, and
the internal lead wire and the external lead wire are copper wires, different from Dumet wire.

18. A light emitting module comprising:
an elongated base board having a first end and a second end at opposed ends of a longitudinal direction of the base board, an upper surface and side surfaces extending in the longitudinal direction of the base board;
first and second conductive members provided at the first end and the second end on the upper surface of the base board, and extending beyond the first and second ends of the base board in the longitudinal direction of the base board;
third and fourth conductive members provided at the first end and the second end of the base board, and extending transverse to the longitudinal direction of the base board, the third and fourth conductive members electrically connected to the first and second conductive members, respectively;
a single line of light-emitting diodes arranged parallel to the longitudinal direction of the base board and between the first conductive member and the second conductive member, the single line of light-emitting diodes being connected in series by wires such that each light-emitting diode is connected to an adjacent light-emitting diode;
end wires that connect longitudinal extremities of the single line of light-emitting diodes to the first and second conductive members, a longitudinal portion of the base board in which the end wires are provided being free from the light-emitting diodes; and
an elongated translucent seal including a wavelength conversion material, the elongated translucent seal enclosing all of the light-emitting diodes of the single line, wherein the light emitting module has an elongated shape,
the elongated translucent seal including the wavelength conversion material contacts all of the light-emitting diodes of the single line, and
a cross-section of the elongated translucent seal, that covers the upper surface and the side surfaces of the base board, has a semicircular shape that is uniform along the longitudinal direction of the base board.

19. The light emitting module according to claim 18,
wherein the seal has a linear shape.

20. The light emitting module according to claim 18,
wherein the base board is a translucent material.

21. The light emitting module according to claim 18,
wherein the base board is composed of a resin material or a ceramic.

22. The light emitting module according to claim 18,
wherein the light-emitting diodes are fixed to the base board by a bonding material.

23. The light emitting module according to claim 18, wherein the seal has a width greater than a width of the base board.

24. The light emitting module according to claim 18, wherein the single line of light-emitting diodes comprises a straight line.

25. The light emitting module according to claim 18, wherein
the elongated translucent seal and the light emitting module have a cylindrical shape.

26. The light bulb according to claim 6, wherein
the base board is flexible.

27. The light bulb according to claim 3, wherein
the first power supply terminal and the first power supply wire are connected by solder, and the second power supply terminal and the second power supply wire are connected by solder.

28. The light emitting module according to claim 18, wherein the elongated translucent seal including the wavelength conversion material comprises a single layer extending from the light emitting diodes to an outer-most surface of the semicircular shape.

29. The light emitting module according to claim 18, wherein the elongated translucent seal further encloses the entire base board.

30. A light bulb comprising:
an elongated filament comprising:
  an elongated base board having a first end and a second end at opposed ends of a longitudinal direction of the base board, and an upper surface;
  a single line of light-emitting diodes arranged parallel to the longitudinal direction of the base board and between the first end and the second end;
  wires that connect the light-emitting diodes in series, each of the wires extending in the longitudinal direction of the base board to connect one of the light-emitting diodes to an adjacent one of the light-emitting diodes; and
  an elongated translucent seal including a wavelength conversion material, the elongated translucent seal enclosing all of the light-emitting diodes of the single line and the entire base board, and enclosing the wires extending in the longitudinal direction of the base board;
a base that receives power;
a lighting circuit that is provided in the base and causes the single line of light-emitting diodes to emit light;
a stem comprising soft glass transparent to visible light;
a first power supply wire and a second power supply wire through which power is supplied to the single line of light-emitting diodes, the first power supply wire being connected to the first end of the base board on one end and to the lighting circuit on an other end, the second power supply wire being connected to the second end of the base board on one end and to the lighting circuit on an other end, each of the first and second power supply wires comprising a Dumet wire sealed inside the stem; and
a housing that houses the base board, the single line of light-emitting diodes, and the first and second power-supply wires, the housing being attached to the base,
wherein the housing has an opening closed by the stem so as to keep the housing airtight,
the first power supply wire and the second power supply wire extend from the elongated filament to the stem, extend into the stem via a longitudinal side surface of the stem, and extend from the stem to the lighting circuit provided in the base via an interior of the stem,
wherein the elongated translucent seal enclosing the entire base board contacts all of the light-emitting diodes of the single line, and
a cross-section of the elongated translucent seal above the base board, which encloses the wires extending in the longitudinal direction of the base board, has a semicircular shape that is uniform along the longitudinal direction of the base board.

31. A light emitting module comprising:
an elongated base board having a first end and a second end at opposed ends of a longitudinal direction of the base board, and an upper surface;
first and second conductive members provided at the first end and the second end on the upper surface of the base board, and extending beyond the first and second ends of the base board in the longitudinal direction of the base board;
third and fourth conductive members provided at the first end and the second end of the base board, and extending transverse to the longitudinal direction of the base board, the third and fourth conductive members electrically connected to the first and second conductive members, respectively;
a single line of light-emitting diodes arranged parallel to the longitudinal direction of the base board and between the first conductive member and the second conductive member;
wires that connect the single line of light-emitting diodes in series, each of the wires extending in the longitudinal direction of the base board to connect one of the light-emitting diodes to an adjacent one of the light-emitting diodes;
end wires that connect longitudinal extremities of the single line of light-emitting diodes to the first and second conductive members, a longitudinal portion of the base board in which the end wires are provided being free from the light-emitting diodes; and
an elongated translucent seal including a wavelength conversion material, the elongated translucent seal enclosing all of the light-emitting diodes of the single line and the entire base board, and enclosing the wires extending in the longitudinal direction of the base board,
wherein the light emitting module has an elongated shape,
the elongated translucent seal enclosing the entire base board contacts all of the light-emitting diodes of the single line, and
a cross-section of the elongated translucent seal above the base board, which encloses the wires extending in the longitudinal direction of the base board, has a semicircular shape that is uniform along the longitudinal direction of the base board.

* * * * *